United States Patent [19]

Temple et al.

[11] Patent Number: 4,739,387
[45] Date of Patent: Apr. 19, 1988

[54] AMPLIFYING GATE THYRISTOR HAVING HIGH GATE SENSITIVITY AND HIGH DV/DT RATING

[75] Inventors: Victor A. K. Temple, Jonesville; Armand P. Ferro, Schenectady, both of N.Y.

[73] Assignee: General Electric Company, Schenectady, N.Y.

[21] Appl. No.: 497,339

[22] Filed: May 23, 1983

Related U.S. Application Data

[63] Continuation of Ser. No. 245,401, Mar. 19, 1981, abandoned, which is a continuation-in-part of Ser. No. 32,362, Apr. 23, 1979, abandoned, which is a continuation-in-part of Ser. No. 733,205, Oct. 18, 1976, abandoned.

[51] Int. Cl.⁴ .............................................. H01L 29/74
[52] U.S. Cl. ........................................ 357/38; 357/20; 357/30; 357/55; 357/86
[58] Field of Search ....................... 357/20, 30, 38, 55, 357/86

[56] References Cited

U.S. PATENT DOCUMENTS 3,995,305  11/1976  Voss ...................................... 357/38

Primary Examiner—Joseph E. Clawson, Jr.
Attorney, Agent, or Firm—Marvin Snyder; James C. Davis, Jr.

[57] ABSTRACT

A thyristor is provided having high gate sensitivity in combination with high dv/dt ratings. An amplifying gate structure is utilized having a pilot thyristor region including a first portion characterized by a first extent and at least one projection of said first portion extending therefrom and having a lateral extent greater than the extent of said first portion; and means substantially isolating said pilot thyristor region from the remainder of the device which means surround said first portion and the sides of said projection.

14 Claims, 3 Drawing Sheets

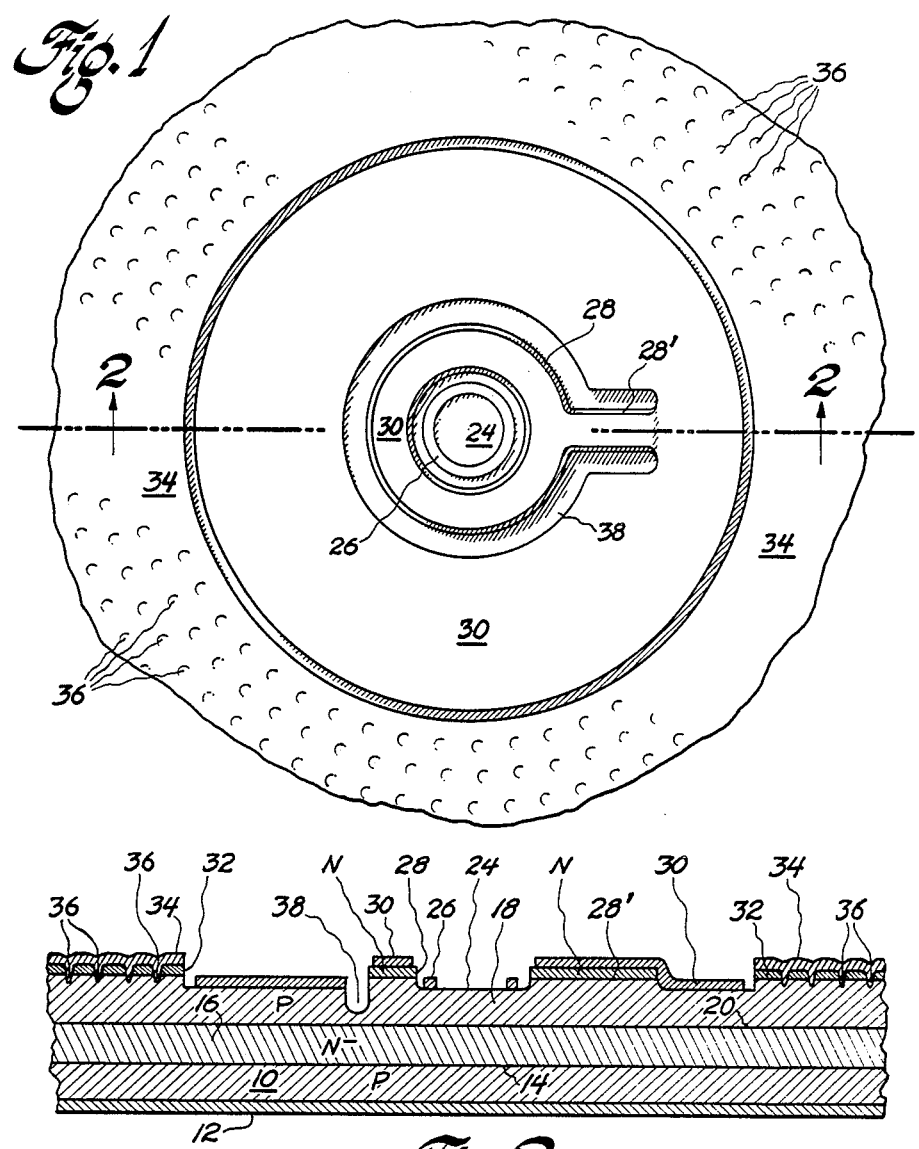
Fig. 1
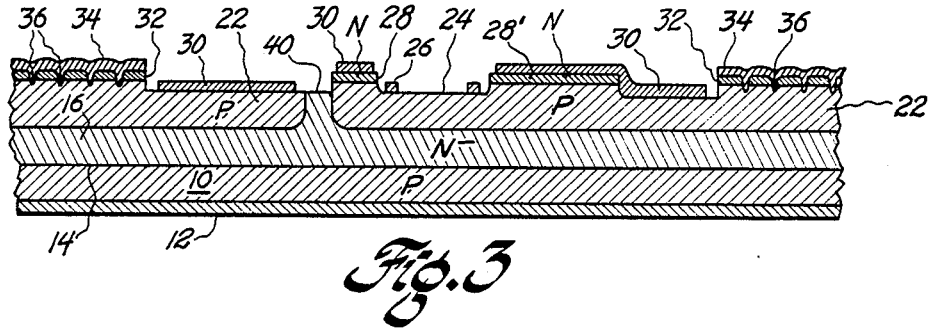
Fig. 2
Fig. 3

AMPLIFYING GATE THYRISTOR HAVING HIGH GATE SENSITIVITY AND HIGH DV/DT RATING

This is a continuation of application Ser. No. 245,401, filed on Mar. 19, 1981 now abandoned, which is a continuation-in-part of application Ser. No. 32,362, filed Apr. 23, 1979 and now abandoned, which is a continuation-in-part of application Ser. No. 733,205, filed Oct. 18, 1976 and now abandoned.

This invention relates, in general, to thyristors and more particularly to an improved gate structure for amplifying gate thyristors which provides increased sensitivity without reduction of dv/dt capability in thyristor devices as compared with devices according to the prior art.

It is desirable to provide thyristor devices having high sensitivities to gate signals for turning on the devices. It has been the practice to provide increased sensitivity by increasing the area of the gate and pilot emitter region of a thyristor device. This practice leads to devices which also have increased sensitivity to dv/dt turn on which is undesirable. The susceptibility of a thyristor to dv/dt turn on is related fundamentally to the depletion capacitance in the gate and pilot emitter area of the device which in turn is directly related to the size of the pilot thyristor portion of an amplifying gate device. It is desirable, therefore, for high dv/dt capability to provide a device having as small a pilot thyristor region as possible consistent with the desired sensitivity. It will be appreciated that the dual aims of (1) increasing gate sensitivity and (2) decreasing the susceptibility to dv/dt turn on are achieved by antithetical structures. Specifically, whereas a large area provides increased sensitivity (especially in radiation triggered devices), favorable dv/dt ratings are achieved with a small area.

Accordingly, it is an object of this invention to provide a thyristor and more particularly an amplifying gate thyristor having both high gate sensitivity and low susceptibility to dv/dt turn on.

It is another object of this invention to provide an improved thyristor of the type described requiring no external circuitry to achieve the objective thereof.

It is yet another object of this invention to provide an improved thyristor structure of the type described which does not require extensive deviation from standard processing technology.

Briefly stated and in accordance with one aspect of this invention, an improved thyristor having gate sensitivity and high dv/dt rating is provided which includes a pilot thyristor section having a first region characterized by a first lateral extent and at least one projection extending therefrom having a lateral extent greater than the lateral extent of said first region. In accordance with one particular embodiment of this invention, a radially symmetrical device is provided having a circular pilot thyristor emitter region including one or more projections extending therefrom in the form of radial arms and means isolating sides of both the radial arms and the external boundary of the central portion of the pilot thyristor from the remainder of the device. In accordance with a presently preferred embodiment of this invention, isolation is achieved by a groove extending from the surface of the thyristor down into the body thereof in order to increase the lateral base impedance in the area of the gate surrounding the pilot thyristor region described. In accordance with an alternative embodiment of this invention, isolation is achieved through selective planar diffusion of the P base region. In accordance with yet another aspect of this invention, isolation is achieved by a moat etch through the forward blocking junction of the thyristor. In accordance with yet another aspect of this invention isolation is achieved by a semiconductor region of like conductivity type as the pilot emitter region partially surrounding the emitter region and laterally spaced therefrom.

The features of the invention which are believed to be novel are pointed out with particularity in the appended claims. The invention itself, however, both as to its organization and method of operation together with further objects and advantages thereof may best be understood by reference to the following description taken in connection with the accompanying drawings in which:

FIG. 1 is a top view of the central portion of an improved thyristor in accordance with this invention.

FIG. 2 is a sectional view of the embodiment of the invention illustrated in FIG. 1, taken along the line 2—2.

FIG. 3 is a sectional view of an alternative embodiment of the invention illustrating isolation created by selective diffusion of the P base region 22 into the N base region 16.

Figure 6:
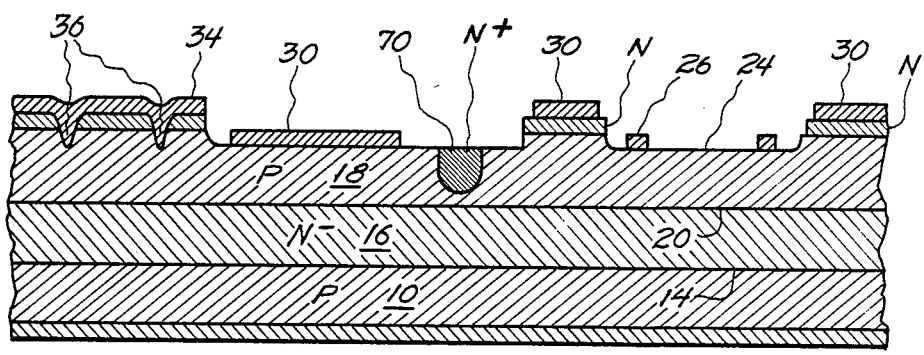

In FIG. 6 an N+ diffusion 70 thins the P region 18 proximate to region 70 to form the isolation means.

Fundamental to the operation of this invention is the different dependence upon gate structure of the turn-on sensitivity of a thyristor to external gate current as compared to displacement current (that is to say dv/dt current). Radially symmetrical gate structures display a sensitivity to an external gate signal which is related to the ratio of the outer to the inner radius of the gate. More specifically, the turn-on sensitivity for an annular amplifying gate structure may be described as $$I_{G\ threshold} = V_{threshold}\ 2\pi\sigma/\ln(r_o/r_{in})$$

wherein $$\sigma = \int_0^t \sigma(y)dy,\ \sigma(y)$$

being the base conductivity and t being the thickness of the base layer. Generally, the sensitivity of a gate structure of this type will be seen to increase as the outer radius increases. While the sensitivity of an annular gate structure is determined by the overall dimensions of the structure, the initially turned-on area is an area substantially less than the total area of the gate structure. Generally, the length of the initial-turn-on line is determined by the geometry of the pilot emitter boundary (here $2\pi r_{in}$) and the lateral extent into the pilot emitter by the rise time and magnitude of the applied gate signal. Since the anode-cathode current flow transfers to main emitter region shortly after turn-on of the pilot thyristor, the pilot thyristor need not be large in area. Since the sensitivity of the pilot to dv/dt turn-on is related to the area of the pilot emitter, it is desired to make that area small while still providing a sufficient inner emitter boundary for reliable turn-on (that is, to achieve desirable di/dt characteristics). However, as was hereinabove described, reducing the outer radius of an annular gate structure reduces the turn-on sensitivity unless a corresponding reduction is made in the inner radius. While simultaneous reduction of the outer and inner radii in order to keep the ratio thereof constant will be effective, it can readily be seen that the initial turn-on line length reduces with the inner radius. In the case of thyristors triggered by a current source, this method may be acceptable insofar as a certain minimum inner radius is maintained to facilitate the construction of the device and consistent with a certain minimum turn-on line length. In radiation triggered designs, however, reduction of the inner radius of an annular gate region reduces the area exposed to radiation which may also be undesirable.

Referring now to FIG. 1, there is illustrated the pilot thyristor portion of an amplifying gate thyristor device including a gate structure in accordance with this invention which provides both increased sensitivity to an externally applied gate signal (in this case a radiation signal) and at the same time reduced sensitivity to dv/dt turn-on. FIG. 1 is a top view of the device, while FIGS. 2 and 3 are cross section views of alternative embodiments of a thyristor in accordance with this invention utilizing different methods for achieving the required isolation surrounding the gate region.

FIG. 2 is taken along section line 2—2. The device is a layered semiconductor structure including semiconductor layers of alternating conductivity type. A first layer 10 is of p-conductivity type semiconductor material and is conventionally referred to as the anode of the device. While a device will be described in accordance with the teachings of this invention which is a p-n-p-n thyristor device. It will be understood by those skilled in the art that complementary conductivity types may be employed if desired to produce a complementary device. A metal electrode 12 may conveniently be provided beneath semiconductor layer 10 to provide thermal and electrical contact thereto. The relative thicknesses of the electrode and the various semiconductor layers of the figures are not intended to be to scale. Overlying p-layer 10 and forming a first junction 14 is n-conductivity type semiconductor layer 16. This layer is conventionally referred to as the n-base layer of the device. Further, p-conductivity type semiconductor layer 18 overlies layer 16 forming junction 20 therebetween, layer 18 being the p-base layer of the device. Each of the anode, n-base and p-base layers may conveniently be formed by epitaxial growth, diffusion into an appropriately doped wafer or otherwise as is well known to those skilled in the art. For example, the structure illustrated in FIG. 3 presumes a mask diffusion method for forming semiconductor layer 22 which is generally analogous to layer 18 in FIG. 2. In the case of FIG. 3, semiconductor layer 22 is formed by the diffusion of P-type impurity atoms into an n-conductivity type semiconductor layer 16 which extends to the surface of the device. Similarly, layer 10 might be formed at the same time as layer 22 by diffusion or might be epitaxially grown on a surface of layer 16 or otherwise as is well known to those skilled in the art.

Those portions of the device in accordance with this invention hereinabove described are substantially visible only in FIG. 2. The remainder of the device may be most clearly understood by reference now to FIG. 1 in conjunction with FIG. 2 as indicated. Radiation sensitive area 24 is formed in p-conductivity type semiconductor layers 18 or 22. Region 24 may conveniently be polished, etched, coated or otherwise treated for the efficient collection of radiation impinging thereon. Light triggered and other types of radiation triggered thyristors are well known in the art and those techniques appreciated by one skilled in the art may readily be employed in conjunction with a device in accordance with this invention. Accordingly, region 24 may conveniently be made thinner than the remainder of region 18 or 22 to most efficiently provide for the formation of carriers in that portion of junction 20 underlying radiation sensitive region 24. Electrode 26 surrounds region 24 and provides for the equal distribution of carriers generated beneath region 24 for the initial turn-on of the device. Electrode 26 is optional and is illustrated herein as a preferred structure in accordance with this invention as applied to light fired thyristor devices. In an electrically fired device region 26 would extend inward to cover region 24 for more convenient contact to the gate. N-conductivity type layer 28 surrounds radiation sensitive region 24 and forms the pilot emitter of the device. N-type conductivity layer 28 is of generally annular shape and includes projection 28' extending radially outward therefrom. Electrode 30 overlies both n-conductivity type layer 28 and a portion of p-conductivity type layer 18 and, in the case of FIG. 3, p-conductivity type layer 22. Electrode 30 connects the end of projection 28' to layer 18 and forms both the cathode of the pilot thyristor portion of a device in accordance with this invention and the gate of the main thyristor section. The main thyristor portion of a device in accordance with this invention includes n-conductivity type layer 32 and electrode 34 which overlies layer 32 and contacts p-conductivity type layers 18 or 22 at a plurality of emitter shorts 36 if desired. Emitter shorts 36 are preferably formed in accordance with this invention to increase the dv/dt capabilities of the main emitter portion of the device in accordance with well known principles. Accordingly, emitter shorts 36 may be omitted where desired.

The P base region of the pilot thyristor portion of a device in accordance with this invention, that is to say the region of the device generally defined as underlying n-conductivity type layer 28, is isolated from the remainder of the device; in FIG. 2 by groove 38 and in the alternative embodiment of FIG. 3 by that portion of n-conductivity type layer 16 which extends to the surface of the device at 40. In both cases, the lateral resistivity of p-base layer 18 (or 22) is increased so that little or no gate current will flow outward from the gate area of the device except as constrained by the groove. Specifically, most of the gate current or photo gate current in a light fired device flows only under extension 28' of n-conductivity type pilot emitter layer 28.

Figure 5:
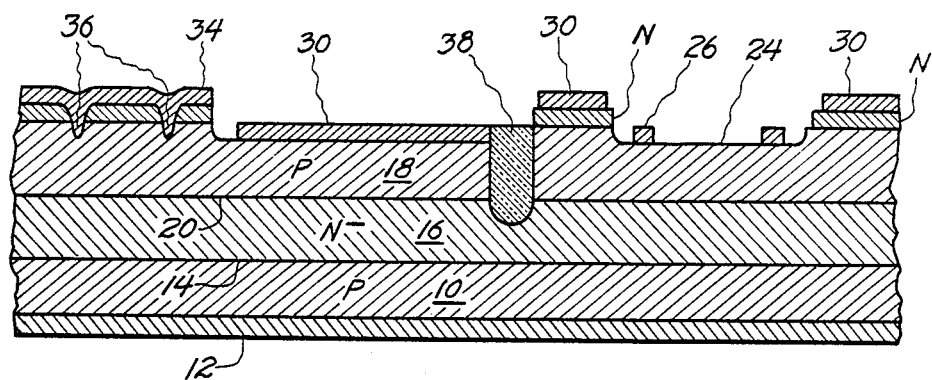
FIG. 5 shows isolation achieved by etching through the blocking junction 20. In this embodiment the exposed junction in this region is passivated by passivant 38.

While groove 38 is illustrated as extending only partially into layer 18 in FIG. 2, it may, it desired, extend through junction 20 into layer 16 as illustrated in the partial section view of FIG. 5. Preferably, groove 38 is filled with passivating material as illustrated to increase the breakdown voltage of the thyristor.

In accordance with a further embodiment of this invention illustrated in FIG. 6, a region of opposite conductivity type to layer 18 replaces groove 38. Region 70 is located adjacent the pilot emitter but spaced laterally therefrom and provides isolation by reducing the thickness of a p-base layer 18 in the area of the additional region.

Figure 4:
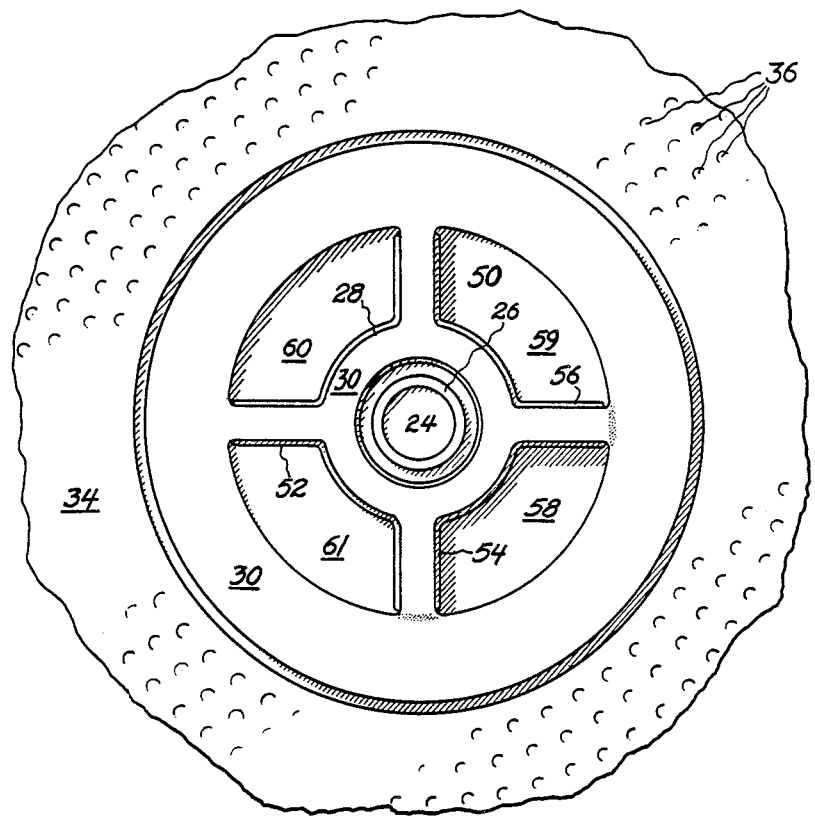
FIG. 4 is a top view of the central portion of an alternative embodiment of a thyristor in accordance with this invention showing a plurality of projections.

FIG. 4 illustrates a thyristor in accordance with this invention which is substantially similar to the device of FIGS. 1, 2 and 3 except that four projections of the type exemplified by 28' are provided. This provides a somewhat more symmetrical device while reducing both the sensitivity to an externally applied gate signal and the sensitivity to dv/dt turn-on. Referring now to FIG. 4 which illustrates only a top view of the device, it being understood that the section views of FIGS. 2 and 3 substantially apply to the device of FIG. 4 with the addition only of the additional projections, projections 50, 52, 54 and 56 are provided.

The remaining reference numerals correspond to the like numerals of FIGS. 1-3.

While FIG. 4 illustrates etched regions 58-61 as extending radially outward a distance approximately equal to the length of projections 50, 52, 54 and 56, it will be understood that a narrow groove or other isolation region as described in conjunction with FIGS. 1-3, 5 and 6 may also be used. In that case, the groove would be located adjacent the boundaries of pilot emitter 28 and projections 50, 52, 54 and 56 extending therefrom.

The advantages of this invention may be readily appreciated by considering two examples of specific devices in accordance herewith. A first example will be provided wherein a device in accordance with the prior art and the device in accordance with the instant invention are designed to have equal sensitivities, the dv/dt capabilities being compared. A second example will compare the sensitivities of devices in accordance with the instant invention and the prior art having equal dv/dt capabilities. In both examples, the prior art gate structure which will be considered as an annular structure having a specified inner and outer radius n+ gate emitter region. The structure in accordance with this invention will be of the type illustrated in FIG. 4 having a specified inner radius, a specified outer radius for the annularly shaped portion of the emitter and full projections of specified width and length, the length being measured in the same way as the aforesaid inner and outer radii, that is to say from the center of the device. In all cases, the p-base conductivity of the device is the same and is designated by $\sigma$ and p-base thickness by t.

The first example utilizes a thyristor in accordance with the prior art having an annular gate emitter having an inner radius of 10 mils and an outer radius of 100 mils. The sensitivity of such a thyristor may be calculated as approximately $0.366/\sigma t$. The sensitivity to anode current density (C dv/dt) is approximately $0.0161/\sigma t$. For purposes of comparison, a device in accordance with the instant invention having the same sensitivity to an externally applied gate signal has an inner radius of 10 mils, an intermediate radius of 25 mils and an outer radius of 34 mils with a projection width of 10 mils. A device of these dimensions has a sensitivity to an externally applied gate signal of $0.365/\sigma t$ and a sensitivity to dv/dt current density or other anode current density of $0.0065/\sigma t$. It will be appreciated that the sensitivities $0.365/\sigma t$ and a sensitivity to anode current density of $0.0065/\sigma t$. It will be appreciated that the sensitivities to externally applied gate signals of the two devices is substantially equal while the sensitivity to anode current density is more than double in the prior art device.

According to the second example, a thyristor in accordance with the prior art is provided having an inner radius of 20 mils and an outer radius of 106 mils. A device of these dimensions has a sensitivity to an externally applied gate signal of $0.374/\sigma t$ and a sensitivity to an anode current density of $0.070/\sigma t$. A device in accordance with this invention having a similar sensitivity to anode current density may be fabricated having an inner radius of 20 mils, an intermediate radius of 35 mils, an outer radius of 70 mils and a projection width of 3.5 mils. A device of these dimensions has a sensitivity to an externally applied gate signal of $2.59/\sigma t$ and a sensitivity to anode current density of $0.071/\sigma t$. It will be seen that with no sacrifice in dv/dt capability, a device is provided having a gate current sensitivity approximately 7 times that of a prior art device.

A thyristor in accordance with this invention has been provided having substantial benefits over prior art types in terms of sensitivity to an externally applied gate signal and relative insensitivity to dv/dt turn-on. A thyristor in accordance with this invention while especially suited to radiation triggered devices and, more particularly, light fired devices may equally well be utilized with devices triggered by a conventional current or voltage signal. Further, while devices in accordance with this invention have been illustrated having one and four projections of generally rectangular shape, it will be understood by those skilled in the art that any number of projections may be used as desired, and that although rectangular projections are preferred, other forms may be utilized.

While the invention has been particularly shown and described with reference to several preferred embodiments thereof, it will be understood by those skilled in the art that various changes in form and detail may be made therein without departing from the true spirit and scope of the invention as defined by the appended claims.

What is claimed is:

1. An Amplifying gate thyristor comprising:
   an anode emitter layer on one major surface of a semiconductor wafer;
   an anode base layer adjacent said anode emitter layer;
   a cathode base layer adjacent said anode base layer and having portions extending to the other major surface of said wafer, said cathode base layer having a maximum predetermined thickness;
   a main cathode emitter region and a pilot thyristor emitter region extending from said cathode base layer to said other major surface a given distance to form a main thyristor and pilot thyristor, respectively;
   said pilot thyristor including gate means;
   said pilot thyristor emitter region including a first emitter portion having a first lateral extent and at least one projection extending outwardly therefrom and having a lateral extent greater than said first lateral extent; and
   means for directing gate current under said projection, said means comprising groove isolating means substantially surrounding said first emitter portion and less than totally surrounding said at least one projection, said groove isolating means extending into said cathode base region to a depth greater than said given distance to form an isolating cathode base region zone of minimum thickness; and
   electrodes connected to said main cathode emitter region and said anode emitter region.

2. The thyristor of claim 1 wherein said first emitter portion of said pilot thyristor emitter region comprises a substantially radially symmetrical region.

3. The thyristor of claim 2 further comprising a radiation sensitive area within said radially symmetrical region responsive to the incidence of radiation thereon to cause gate current to flow under said projection so as to turn on the thyristor.

4. The thyristor of claim 1 wherein said groove isolating means comprises a groove substantially filled with passivating material.

5. An amplifying gate thyristor having a semiconductor body and comprising:
a first emitter region;
a first base region adjacent said first emitter region;
a second base region adjacent said first base region and having portions extending to an exterior surface of said semiconductor body, said second base region comprising a layer with a maximum predetermined thickness;
a pilot stage emitter region and a second stage emitter region extending from said second base region to said exterior surface a given distance so as to form a pilot stage thyristor and a second stage thyristor, respectively;
said pilot stage thyristor including gate means;
said pilot stage emitter region including a first emitter portion having a first lateral extent and at least one projection extending outwardly therefrom and having a lateral extent greater than said first lateral extent; and
means for directing gate current under said projection, said means comprising groove isolating means substantially surrounding said first emitter portion and less than totally surrounding said at least one projection, said groove isolating means extending into said second base region to a depth greater than said given distance to form an isolating second base region zone of minimum thickness; and an electrode connected to said first emitter region.

6. The thyristor of claim 5 wherein said first emitter portion of said pilot thyristor emitter region comprises a substantially radially symmetrical region.

7. The thyristor of claim 6 further comprising a radiation sensitive area within said radially symmetrical region responsive to the incidence of radiation thereon to cause gate current to flow under said projection so as to turn on the thyristor.

8. The thyristor of claim 5 wherein said groove isolating means comprises a groove substantially filled with passivating material.

9. The thyristor of claim 5 wherein said first base region comprises N-conductivity type semiconductor material.

10. An amplifying gate thyristor having a semiconductor body and comprising:
a first emitter region;
a first base region adjacent said first emitter region;
a second base region adjacent said first base region and having portions extending to an exterior surface of said semiconductor body;
a pilot stage emitter region and a second stage emitter region extending from said second base region to said exterior surface so as to form a pilot stage thyristor and a second stage thyristor, respectively;
said pilot stage thyristor including gate means;
said pilot stage emitter region including a first emitter region having a first lateral extent and at least one projection extending outwardly therefrom and having a lateral extent greater than said first lateral extent; and
means for directing gate current under said projection, said means comprising a portion of said first base region extending through said second base region and to said exterior surface and substantially surrounding said first emitter portion but less than totally surrounding said at least one projection; and
an electrode connected to said first emitter region.

11. The thyristor of claim 10 wherein said first emitter portion of said pilot stage emitter region comprises a substantially radially symmetrical region.

12. The thyristor of claim 11 further comprising a radiation sensitive area within said radially symmetrical region responsive to the incidence of radiation thereon to cause gate current to flow under said projection so as to turn on the thyristor.

13. The thyristor of claim 10 wherein said first base region comprises N-conductivity type semiconductor material.

14. A light controlled thyristor comprising a semiconductor element which has a cathode area which receives light energy formed on one surface, a main emitter region and an auxiliary emitter region formed in said one surface and said auxiliary emitter region located between said cathode area and said main emitter region, said semiconductor element has a base layer region of thickness on said first surface which has a dopant concentration which decreases as a function of distance from said one surface, an auxiliary emitter electrode which contants said base layer and said auxiliary emitter region (2) and separated by a groove (6) which separates the part of the auxiliary emitter electrode (4) which contacts said base layer in part of its circumference from said part which contacts said auxiliary emitter, said groove extending into said base layer region and being at least as deep as said auxiliary emitter region, and a particular section of auxiliary emitter area (2) which carries the auxiliary emitter electrode (4) which contacts the base region (3) forms one or more bridges (11,16) which are at least on two sides terminated by said groove (6).

* * * * *